United States Patent

Maoz et al.

[11] Patent Number: 5,541,366
[45] Date of Patent: Jul. 30, 1996

[54] FOAM PRINTED CIRCUIT SUBSTRATES

[75] Inventors: Joseph Maoz; Michael Kadishevitz, both of Tel Aviv, Israel

[73] Assignee: M-Rad Electromagnetic Technology Ltd., Tel Aviv, Israel

[21] Appl. No.: 354,330

[22] Filed: Dec. 12, 1994

[51] Int. Cl.⁶ .................................................. H05K 1/00
[52] U.S. Cl. ...................... 174/258; 174/250; 174/254; 361/750; 361/748; 29/831; 29/829
[58] Field of Search ..................................... 174/250, 254, 174/256, 258; 361/748, 749, 750; 29/829, 830, 831

[56] References Cited

U.S. PATENT DOCUMENTS

| | | | |
|---|---|---|---|
| 3,222,442 | 12/1965 | Parker et al. | 264/277 |
| 4,062,750 | 12/1977 | Butler | 204/195 P |
| 4,329,779 | 5/1982 | England | 29/840 |
| 4,403,107 | 9/1983 | Hoffman | 174/68.5 |
| 4,708,281 | 11/1987 | Nelson et al. | 228/180.1 |
| 4,870,429 | 9/1989 | Fujita et al. | 346/137 |
| 4,937,585 | 6/1990 | Shoemaker | 343/700 |
| 5,061,943 | 10/1991 | Rammos | 343/770 |
| 5,313,015 | 5/1994 | Hoge | 174/35 R |

*Primary Examiner*—Laura Thomas
*Attorney, Agent, or Firm*—Mark M. Friedman

[57] ABSTRACT

A printed circuit board having foamed substrates of low dielectric constant and low dissipation factor and techniques for making printed circuit boards and printed circuits using such substrates. The substrate has a dielectric constant less than 1.5 and a dissipation factor less than $10^{-2}$, most preferably, polymethylacrylimide. A conductive layer is placed on the substrate surface using chemical deposition or by use of appropriate adhesives. The printed circuit may be imprinted by conventional techniques such as etching with appropriate etching materials.

9 Claims, 1 Drawing Sheet

FOAM PRINTED CIRCUIT SUBSTRATES

FIELD AND BACKGROUND OF THE INVENTION

The present invention relates to substrates for printed circuit boards and, more particularly, to materials which may be used as printed circuit board substrates and methods for using such substrates in the fabrication of printed circuits.

Printed circuits have long ago replaced wire circuits in the vast preponderance of applications. A printed circuit makes it possible to economically and reliably produce many copies of highly complicated circuits, which take up relatively little space.

To produce a printed circuit, a thin sheet of conductive metal, typically copper or aluminum, is made to adhere to one or more faces of a substrate. The substrate is typically in the form of a sheet of appropriate thickness and mechanical properties used to preserve the shape of the conductive layer and give the structure strength. The conductive layer is subsequently exposed to a printing process which imprints onto the conductor surface the precise image of the circuit design. Etching techniques are then used to remove certain portions of the conductor layer so as to leave the precise circuit desired.

The choice of substrate is of great importance since its electrical properties significantly affect the performance and efficiency of the circuit, especially at high frequencies. This will be increasingly the case in the future as faster logics, such as higher switching frequencies and denser conductive patterns, will increasingly require a substrate of low dielectric constant and low dissipation losses.

A variety of substrates are in current use, among them glass epoxy, tetrafluoroethylene or Teflon® and Duroid®.

While such substrates provide adequate mechanical properties, their electrical properties leave something to be desired. Specifically, these substrates have dielectric constants and dissipation factors which in certain applications be sufficiently high to adversely affect the performance and efficiency of the printed circuit. In addition, these substrates are relatively costly and of relatively high density, thereby raising both the cost and the weight of the finished printed circuits.

There is thus a widely recognized need for, and it would be highly desirable to have, printed circuit boards substrate which have significantly lower dielectric constants and dissipation factors than those of commonly used substrates and which, in addition, is less costly and of lower density.

SUMMARY OF THE INVENTION

According to the present invention there is provided a primed circuit board comprising a foamed substrate having a dielectric constant less than 1.5 and a dissipation factor less than $10^{-2}$.

According to the present invention there is further provided a method of making a printed circuit board, comprising: placing a layer of conductive material onto a foamed substrate having a dielectric constant less than 1.5 and a dissipation factor less than $10^{-2}$.

Further according to the present invention there is provided a printed circuit, comprising a printed circuit board including a foamed substrate having a dielectric constant less than 1.5 and a dissipation factor less than $10^{-2}$;

According to the present invention there is further provided a method of making a printed circuit, comprising: (a) placing a layer of conductive material onto a foamed substrate having a dielectric constant less than 1.5 and a dissipation factor less than $10^{-2}$; (b) printing a circuit design onto the conductive layer; (c) treating the conductive layer so as to remove portions of the layers which are not part of the circuit.

According to further features in preferred embodiments the substrate is made of foamed polystyrene, such as Styrofoam®, or, preferably, a polyacrylimide, most preferably polymethylacrylimide.

According to further features in preferred embodiments of the invention described below, the printed circuit board further includes a conductive layer, typically copper or aluminum, attached, as by adhesives, to at least one surface of the substrate.

The present invention successfully addresses the shortcomings of the presently known configurations by providing a substrate, preferably polymethylacrylimide rigid foam, for use in printed circuits which has low dielectric constants and low dissipation factors. Use of such a substrate greatly minimizes the adverse interference of the substrate with the operation of the circuit, thereby enhancing its performance and raising its efficiency.

A layer of conductive material may be attached to one or both surfaces of the substrate, and/or to one or more of its edges, by a variety of techniques, including chemical deposition or through the use of appropriate adhesives having suitable electrical properties.

The printed circuit may be imposed on the conducting layer by conventional means, including photolithography with subsequent etching. The etching is carried out using etchants which are compatible with the substrate.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
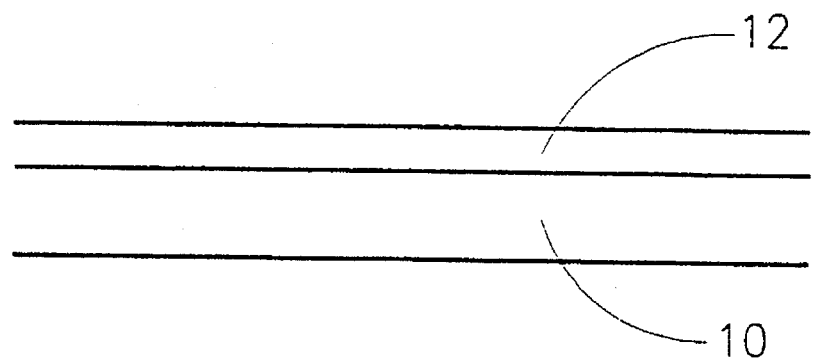
FIG. 1 is a schematic cross-sectional depiction of one embodiment of a printed circuit board according to the present invention showing a foamed substrate and a conductor layer.
Figure 2:
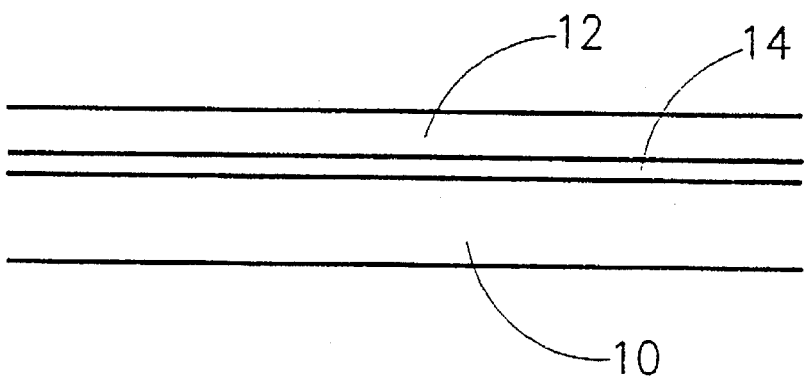
FIG. 2 is a depiction of another embodiment of a printed circuit board according to the present invention showing a foamed substrate, an adhesive layer and a conductor layer.

The present invention is of a printed circuit board, a printed circuit assembly, and methods of making these, which involve use of a foamed substrate made of a material with suitable mechanical properties and having low dielectric constants, preferably below 1.5, and low dissipation factors, preferably below $10^{-2}$.

According to the present invention the foamed substrate of the printed circuit board is made of a material having a dielectric constant of less than 1.5 and a dissipation factor of less than $10^{-2}$.

Examples of such materials include foamed polystyrene, such as Styrofoam®. Typical electrical properties of Styrofoam® 103.7, measured at 3 GHz are a dielectric constant of 1.03 and a dissipation factor of $10^{-4}$. At 10 GHz the dielectric constant and dissipation factor are 1.03 and $1.5 \cdot 10^{-4}$, respectively.

Preferably, the substrate is made of a polyacrylimide, most preferably polymethylacrylimide (PMI) in any form, most preferably of polymethylacrylimide rigid foam, such as, but not limited to, the PMI products sold under the Rohacell trade name. In what follows discussion is focused on PMI as an illustrative material from which substrates according to the present invention may be made. Discussion in detail of PMI is not intended to in any way limit the scope of the present invention.

PMI has excellent mechanical properties, including high dimensional stability under heat, solvent resistance, and a low coefficient of heat conductivity. Furthermore, PMI has very high strength and moduli of elasticity and shear. It is these desirable mechanical properties which make PMI useful in the construction of light weight high strength structures, for example, in aeronautical applications, and also as antenna protectors and radar covers (radomes).

PMI foam can be manufactured by any suitable means, such as by the hot foaming of copolymer sheets made up of methacrylic acid and methacrylonitrile. During the foaming the copolymer is converted to polymethylacrylimide. The foaming temperature is typically above 170° C. with the precise temperature depending on the desired density a After foaming, the block is cooled to room temperature.

Apart from its excellent mechanical properties, PMI, especially in the form of a light foam, also possesses outstanding electrical properties as can be seen from the following table which shows dielectric constants and dissipation factors for PMI of various gross densities measured at 24 GHz and 23° C.

| Density ($kg/m^3$) | Dielectric Constant | Dissipation Factor $\cdot 10^{-2}$ |
| --- | --- | --- |
| 32 | 1.05 | 0.088 |
| 52 | 1.071 | 0.156 |
| 75 | 1.106 | 0.256 |
| 110 | 1.180 | 0.460 |
| 170 | 1.240 | 0.573 |
| 190 | 1.315 | 0.785 |

As the table demonstrates, PMI rigid foams are lightweight in comparison with conventional printed circuit substrates, such as Teflon. More importantly, the dielectric constants and dissipation factors of PMI foams is considerably lower than the comparable values for conventional substrates. This makes substrates according to the present invention more suitable for printed circuit applications operating in the microwave range (0.5 GHz and up). It should also be noted that the electrical properties of the foams improve as the density decreases. To select an optimum foam, one would normally weigh the improvement in electrical properties against the deterioration in physical properties as the density decreases.

The low dielectric constants assure a wider band width than is possible with conventional substrates. The low dielectric constant also brings about lower mutual coupling level among adjoining elements in antenna array applications. The low dissipation factors serve to reduce losses and render the circuit more efficient. The low densities ensure that the boards will weigh less and therefore be more easily handled.

It is the combination of excellent mechanical and electrical properties which makes PMI and related materials highly desirable substrates for printed circuit boards.

To make such materials useful for applications such as printed circuit board substrates, it is necessary to have methods of coating one or more surfaces of the substrate with a conductor, such as copper or aluminum. It is also necessary to have ways of imprinting a circuit onto the conductor, and of etching of the conductor to produce the desired printed circuit. All this must be done without adversely affecting the mechanical and electrical properties of the PMI foam.

PMI rigid foam is typically supplied in sheets of various specific thicknesses and is available in any of several gross densities. The sheets are obtained by cutting or sawing large blocks of material, which leaves the surfaces of the PMI relatively rough. The substrate can also be formed, for example, by heat treating and pressing, so as to conform to the size and shape of the structure to which it is to be attached.

It is preferable to attach the conductor layer to a relatively smooth surface. For this purpose it may be desirable to polish the surface in question. Alternatively, it may be desirable to press a sheet of PMI foam using a suitable pressure for a suitable time while heating to a suitable extent. Preferably, this is carried out in a press which is capable of being alternately cooled and heated. As the heat penetrates into the PMI sheet, the outer cells give way and are squeezed flat, which increases the gross density of the outside layer. This serves to increase the indentation resistance and to smooth out the surface of the sheet.

A conductor layer, such as copper or aluminum, (12) can be attached to the surface of the PMI rigid foam sheet (10) in any suitable way. Two such methods include chemical coating and attachment using adhesives.

In chemical coating, the surface of the substrate is first coated with a thin layer, typically of silver, typically under one micron thick. A layer of copper or aluminum of suitable thickness is subsequently deposited onto the thin silver layer by the process of electrolysis. Normally, since silver cannot be conveniently etched, use of this technique requires that the circuit be printed directly through a mask. Use of this method further requires that the surface be relatively smooth, which can be accomplished, for example, by pressing with heat as described above.

Attachment using adhesives may be accomplished in at least two basic ways. These methods do not normally require that the substrate surface be smooth. One method is to first coat, as by spraying or placing an adhesive film, (14) the substrate surface with a layer of suitable adhesive, preferably less than 0.1 mm in thickness. The conductor layer is then placed onto the adhesive-coated substrate and the substrate and conductor layer are pressed together, typically while heating, to effect a tight bonding.

The adhesive may be any adhesive capable of binding metal, such as copper or aluminum, to the substrate surface. One example of such adhesive is Scotch-Weld 4060 (Trademark) made by the 3M Company. Scotch-Weld 4060 is a high strength, heat-activatable, non-supported adhesive film which has good adhesion to metal, wood, fabric and some plastics. To use such an adhesive, a portion of adhesive film of the appropriate size and shape is cut. The substrate and conductor layer are then joined with the adhesive film between them and are bonded together with the heal of heating to a minimum temperature of 150° C. The temperature is maintained long enough for the adhesive to wet the bonding surfaces. Sufficient pressure is applied to maintain good contact between the surfaces being bonded during the heating cycle. The pressing with heating may obviate the need to, or may reduce the significance of, the smoothing of the substrate surface described above.

A second method of attaching a conductor layer to the substrate using adhesives is to use a conductor layer which has been pre-coated with adhesive. Typical of such materials are Duraver® CE (cyanate ester matrix), Duraver® BT (bismaleinimide triazine matrix), Duraver® PD (polyimide matrix), made by Isola, and the like.

The adhesive used in attaching a conductor layer to the substrate is of importance since an adhesive having unsuitable electrical properties will adversely affect the properties of the resulting board. It is important to use adhesives having low dielectric constants and low dissipation factors in the operative frequency range.

Once the conductor layer has been attached in some suitable way to the substrate, an image of the desired circuit can be imprinted onto the conductor surface using conventional technology, using suitable materials. The imprinted conductor layer can then be etched to remove the undesired conductor and leave behind the desired circuit.

The etching process used may be any suitable conventional technique, possibly with somewhat different chemicals to ensure that the etching material used is compatible with the substrate. Most conventional etching techniques make use of alkali solutions. These cannot be readily used with substrates such as PMI since alkali solutions attack the substrate. It should be noted, however, that it is possible to use alkali solutions provided that the adhesive used is sufficiently thick and/or sufficiently resistant to the alkali solutions so as to prevent any contact between the alkali solutions and the substrate. To ensure that no contact can be made between the surface and the alkali solutions, it may further be necessary to coat alkali the surfaces of the substrate, including the edges, with an alkali-resistant material.

Where it is important to keep the substrate from contacting alkali solutions, it is preferably to use etching materials other than using alkali solution, for example a solution of Ronetch PS® made by LeaRonal, in sulfuric acid. Using such suitable etchants leads to a printed circuit which is comparable to those obtained using conventional etchants. But, in contrast with conventional printed circuits, a printed circuit using a substrate according to the present invention is lighter and, more importantly, has better performance characteristics and efficiency and is less costly.

Substrates according to the present invention may be used as a printed circuit having a single layer. Alternately, a number of layers of such substrates, may be used to form a printed circuit having a number of layers. In other embodiment, a structure may be formed which features one or more substrates according to the present invention interspersed with one or more layers of one or more of conventional substrates, such as Teflon.

While the invention has been described with respect to one preferred embodiment, it will be appreciated that many variations, modifications and other applications of the invention may be made.

What is claimed is:

1. A printed circuit board, comprising:
   (a) a foamed substrate; and
   (b) metallic electrically conductive material formed on said foamed substrate, said electrically conductive material constituting a part of a printed electrical circuit.

2. A printed board as in claim 1 further comprising a conductive layer attached to at least one surface of said substrate.

3. A printed circuit board as in claim 2 wherein said metallic electrically conductive layer is attached to said substrate by means of an adhesive.

4. A printed circuit, comprising a printed circuit board including
   (a) a foamed substrate; and
   (b) metallic electrically conductive material formed on said foamed substrate, said electrically conductive material constituting a part of printed electrical circuit.

5. A printed circuit as in claim 4 wherein said printed circuit board further includes a conductive layer attached to at least one surface of said substrate.

6. A method of making a printed circuit, comprising:
   (a) placing a layer of metallic conductive material onto a foamed substrate;
   (b) treating said metallic conductive layer so as to remove portions of the layer which are not part of the circuit, leaving metallic electrically conductive material constituting a part of a printed electrical circuit.

7. A method as in claim 6 wherein said layer of metallic conductive material is attached to said foamed substrate with adhesive.

8. A method of making a printed circuit board, comprising forming metallic electrically conductive material on a foamed substrate using deposition, said metallic electrically conductive material constituting a part of a printed electrical circuit.

9. The method of claim 8, further comprising precoating said substrate with an adhesive prior to forming said metallic electrically conductive material on said foamed substrate.

* * * * *

UNITED STATES PATENT AND TRADEMARK OFFICE
CERTIFICATE OF CORRECTION

PATENT NO. : 5,541,366
DATED : July 30, 1996
INVENTOR(S) : Joseph Moaz et al

It is certified that error appears in the above-indentified patent and that said Letters Patent is hereby corrected as shown below:

-Cover Sheet: insert, "Related U.S. Application Data
                Continuation of Ser. No. 889,903, 29 May 1992, abandoned"

Signed and Sealed this

Eleventh Day of March, 1997

Attest:

BRUCE LEHMAN

Attesting Officer      Commissioner of Patents and Trademarks